(12) United States Patent
Ku

(10) Patent No.: US 6,258,716 B1
(45) Date of Patent: Jul. 10, 2001

(54) CVD TITANIUM SILICIDE FOR CONTACT HOLE PLUGS

(75) Inventor: Tzu-Kun Ku, Taipei (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/298,452

(22) Filed: Apr. 23, 1999

Related U.S. Application Data

(62) Division of application No. 08/954,039, filed on Oct. 20, 1997, now Pat. No. 5,930,671.

(51) Int. Cl.$^7$ .................................................. H01L 21/44
(52) U.S. Cl. ........................... 438/654; 438/649; 438/629
(58) Field of Search ..................................... 438/597, 682, 438/675, 680, 630, 644, 654, 655, 649, 683, 629, 674

(56) References Cited

U.S. PATENT DOCUMENTS

| | | | |
|---|---|---|---|
| 5,066,612 | 11/1991 | Ohba et al. | 437/192 |
| 5,138,432 | * 8/1992 | Stanasolovich et al. | |
| 5,376,405 | 12/1994 | Doan et al. | 427/126.1 |
| 5,534,730 | 7/1996 | Mori et al. | 257/757 |
| 5,846,881 | * 12/1998 | Sandhu et al. | 438/683 |
| 5,976,976 | * 11/1999 | Doan et al. | 438/683 |

OTHER PUBLICATIONS

J. Hu, et al. "Electrical properties of Ti/TiN films prepared by CVD and their applications in submicron structures as contact and barrier materials", Thin Solid Films, vol. 308–309, pp. 589–593, Oct. 1997.*

* cited by examiner

*Primary Examiner*—Caridad Everhart
(74) *Attorney, Agent, or Firm*—George O. Saile; Stephen B. Ackerman; Larry J. Prescott

(57) ABSTRACT

A method of filling contact holes in a dielectric layer on an integrated circuit wafer. The method reduces processing steps and results in a reliable metal plug filling the contact hole. In one embodiment the contact hole is filled using blanket deposition of titanium silicide using chemical vapor deposition followed by etchback. In a second embodiment the contact hole is filled with titanium silicide using selective chemical vapor deposition of titanium silicide. In a third embodiment an adhesion layer of titanium silicide is formed on the sidewalls and bottoms of the contact holes. A conductor metal of titanium silicide, aluminum, tungsten, or copper is used to fill the contact hole using selective chemical vapor deposition.

8 Claims, 5 Drawing Sheets

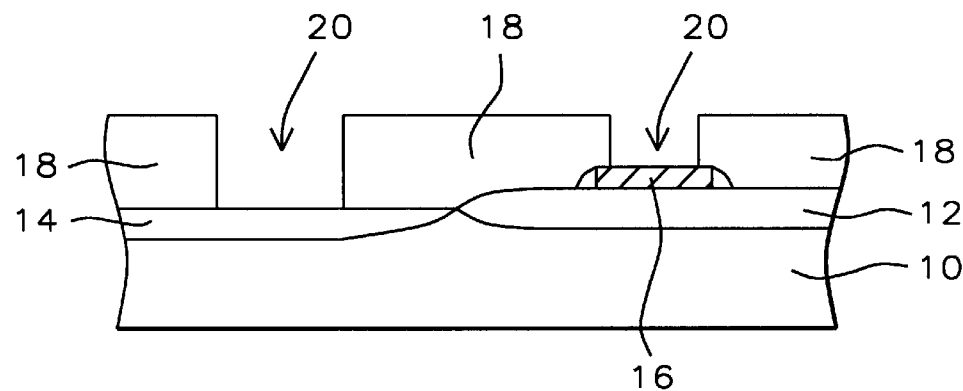
FIG. 1A
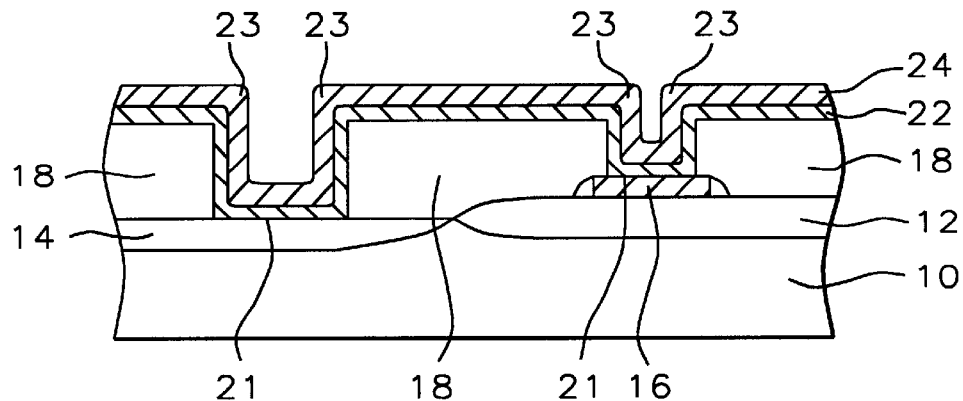
FIG. 1B – Prior Art
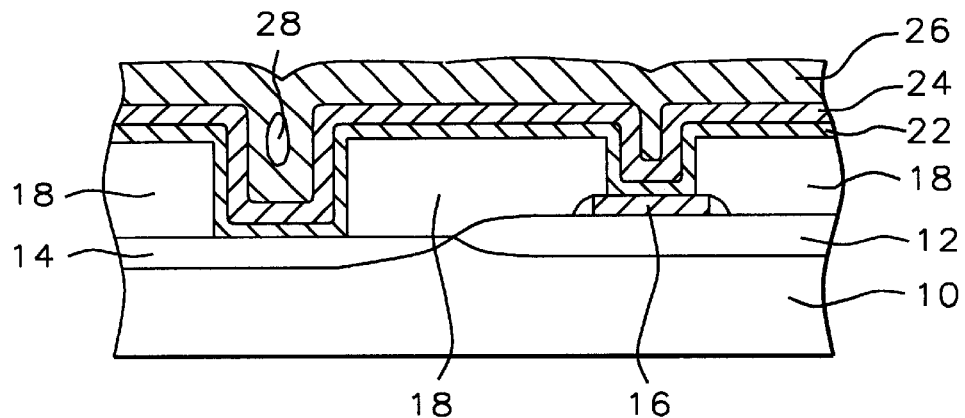
FIG. 1C – Prior Art

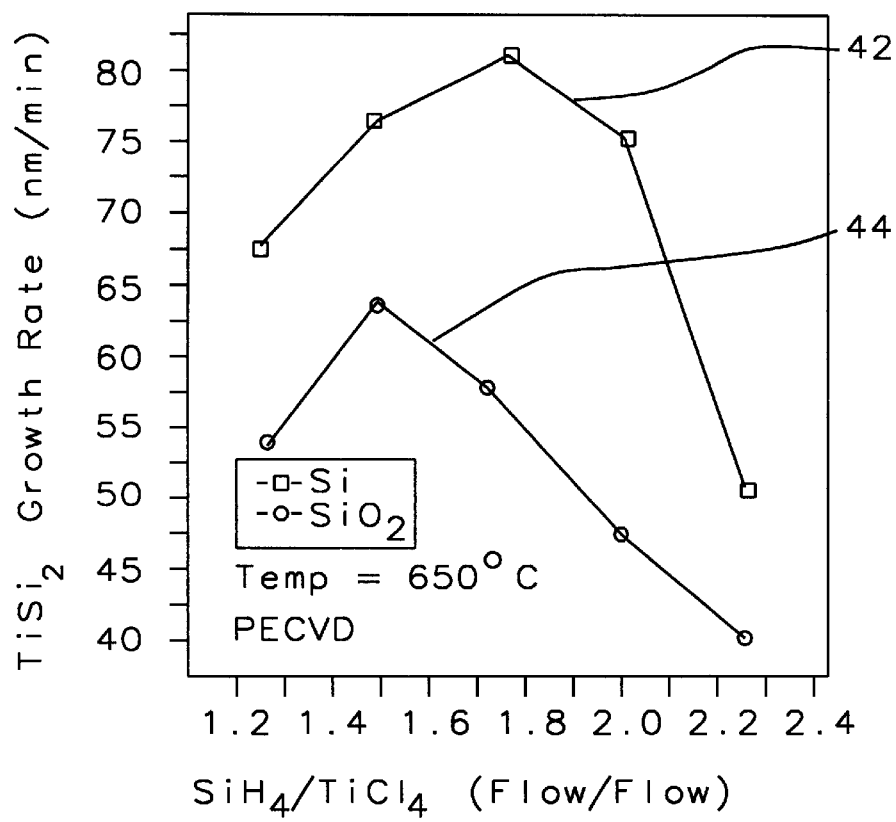
*FIG. 7 - Prior Art*
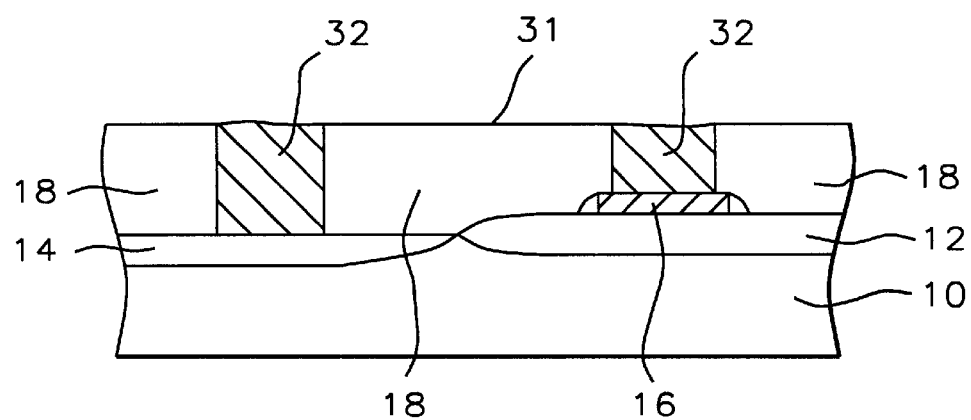
*FIG. 8*

CVD TITANIUM SILICIDE FOR CONTACT HOLE PLUGS

This is a division of patent application Ser. No. 08/954,039, filing date Oct. 20, 1997, now U.S. Pat. No. 5,930,671, Cvd Titanium Silicide For Contact Hole Plugs, assigned to the same assignee as the present invention.

BACKGROUND OF THE INVENTION (1) Field of the Invention

This invention relates to methods of filling contact holes in dielectric layers with conducting metal plugs and more specifically to methods of using chemical vapor deposition of titanium suicide to form conducting metal plugs.

(2) Description of the Related Art

Contact holes in dielectric layers formed on integrated circuit wafers are typically filled by forming layers of titanium and titanium nitride using sequential sputtering forming layers of titanium and titanium nitride on the sidewalls and bottoms of the via holes. The wafer is then thermally processed to form titanium silicide at those points where the titanium is in contact with silicon. A blanket deposition of tungsten or other metal is then used to fill the contact holes.

U.S. Pat. No. 5,534,730 to Mori et al. describes contact holes with thin oxide at the bottom. Titanium silicide, $TiSi_x$, is deposited in the contact hole using chemical vapor deposition. As the $TiSi_x$ film is formed the oxide is reduced and the titanium silicide forms a conductive contact to the silicon below the oxide.

U.S. Pat. No. 5,376,405 to Doan et al. describes a method of using chemical vapor deposition for depositing titanium silicide on a an integrated circuit wafer.

U.S. Pat. No. 5,066,612 to Ohba et al. describes the use of multilayer insulating layers for activating selective metal growth in filling contact holes with metal.

This invention describes methods of filling contact holes in dielectric layers formed on an integrated circuit wafer using chemical vapor deposition of titanium silicide.

SUMMARY OF THE INVENTION

In the manufacture of integrated circuit wafers a layer of dielectric is formed over the wafer after the devices have been formed in the wafer and some electrodes, usually polysilicon electrodes have been formed. It is necessary to form contact or via holes in this dielectric layer and to fill these contact or via holes with conductor metal so that electrical patterns formed on the dielectric layer have electrical connection to the appropriate points of the devices formed in the wafer and electrodes formed on the wafer.

FIG. 1A shows a cross section view of a part of an integrated circuit wafer showing the semiconductor wafer 10, a diffused region 14 formed in the wafer 10, and a field oxide isolation region 12. A polysilicon electrode 16 is shown formed on the field oxide region 12. A dielectric layer 18, usually silicon dioxide, is formed on the integrated circuit wafer and contact holes 20 are formed in the dielectric layer 18.

A conventional method of filling the contact holes with conductor metal is shown in FIGS. 1B and 1C. As shown in FIG. 1B layers of titanium 22 and titanium nitride 24 are sequentially sputter deposited on the wafer forming layers of titanium 22 and titanium nitride 24 on the sidewalls and bottom of the via holes. The wafer is then thermally processed to form titanium silicide at those points 21 where the titanium is in contact with silicon. As shown in FIG. 1B the step coverage of the titanium nitride layer at the edge of the contact holes 23 is poor. As shown in FIG. 1C a blanket layer of tungsten 26 is deposited on the wafer to fill the contact holes. As shown in FIG. 1C the poor step coverage of the titanium nitride can cause voids 28 to form in the tungsten filling the via. The tungsten is then etched back to leave tungsten only in the contact holes, not shown.

The conventional method described above is a complex process and the poor step coverage of the titanium/titanium nitride layer causes reliability and other problems in the tungsten, or other metal, plug filling the contact hole. These problems become more severe as the diameters of the contact holes decrease, as happens with increasing circuit density.

It is a principle objective of this invention to provide simplified methods for filling contact holes with conducting metal plugs.

It is another r principle objective of this invention to provide methods for filling contact holes with conducting metal plugs which result in improved quality and reliability of the conducting metal plugs.

These objectives are achieved by using blanket deposition of titanium silicide to completely fill the contact holes, by selective deposition of titanium silicide to completely fill the contact holes, or by depositing a titanium silicide adhesion layer on the sidewalls and bottom of the contact holes and filling the contact holes with titanium silicide, tungsten, aluminum, or copper. The titanium silicide, tungsten en, aluminum, and copper are deposited using chemical vapor deposition.

BRIEF DESCRIPTION OF THE DRAWINGS

FIG. 1A shows a cross section view of an integrated circuit wafer having devices formed therein, a dielectric layer formed thereon, and contact holes formed in the dielectric layer.

FIG. 1B shows a cross section view of the integrated circuit wafer of FIG. 1A with blanket layers of titanium and titanium nitride deposited on the wafer.

FIG. 1C shows a cross section view of the integrated circuit wafer of FIG. 1A with a blanket layer of tungsten formed on the layers of titanium and titanium nitride.

FIG. 7 shows curves of the titanium silicide growth rate on silicon and silicon dioxide as a function of the silane to titanium tetrachloride flow ratio. The curves in FIG. 7 are taken from the Journal of the Electrochemical is Society, Vol. 139, No. 4, 1992, page 1159.

FIG. 8 shows a cross section view of the integrated circuit wafer of FIG. 6 after the titanium silicide has been etched back, using reactive ion etching, or polished back, using chemical mechanical polishing, to the surface of the dielectric layer.

DESCRIPTION OF THE PREFERRED EMBODIMENTS

Figure 2:
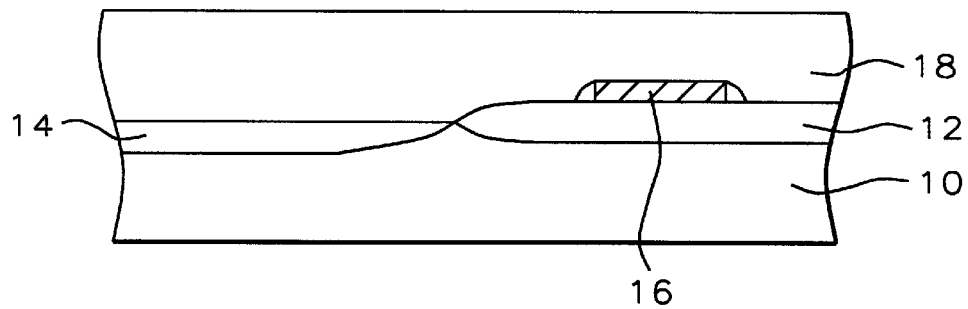
FIG. 2 shows a cross section view of an integrated circuit wafer having devices formed therein and a dielectric layer formed thereon.

Refer now to FIGS. 2–5 for a preferred embodiment of the method of this invention. FIG. 2 shows a cross section view of a part of an integrated circuit wafer showing the semiconductor wafer 10, a diffused region 14 formed in the wafer 10, and a field oxide isolation region 12. A polysilicon electrode 16 is shown formed on the field oxide region 12. A dielectric layer 18 is formed on the integrated circuit wafer. In this example the dielectric layer is silicon dioxide having a thickness of between about 0.7 and 1.0 micrometers. This example, and the examples that follow, show a particular part of the integrated circuit wafer. Those skilled in the art will readily recognize that polysilicon electrodes can be formed at other locations of the wafer and that the invention will work equally well for other parts of the integrated circuit wafer.

Figure 3:
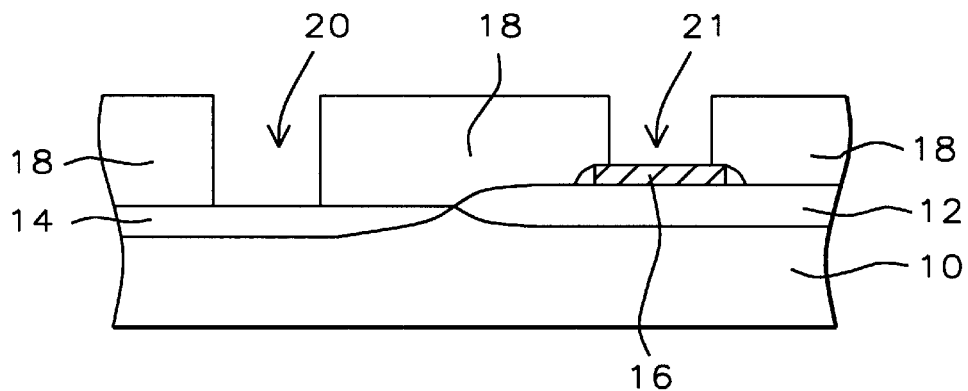
FIG. 3 shows a cross section view of the integrated circuit wafer of FIG. 2 with contact holes formed in the dielectric layer.

As shown in FIG. 3, contact holes 20 are then formed in the dielectric layer 18. In this example the contact holes 20 are formed using reactive ion etching and have a diameter of between about 0.2 and 0.5 micrometers. FIG. 3 shows one contact hole 20 exposing part of a silicon junction region and one contact hole 21 exposing part of a polysilicon electrode.

Figure 4:
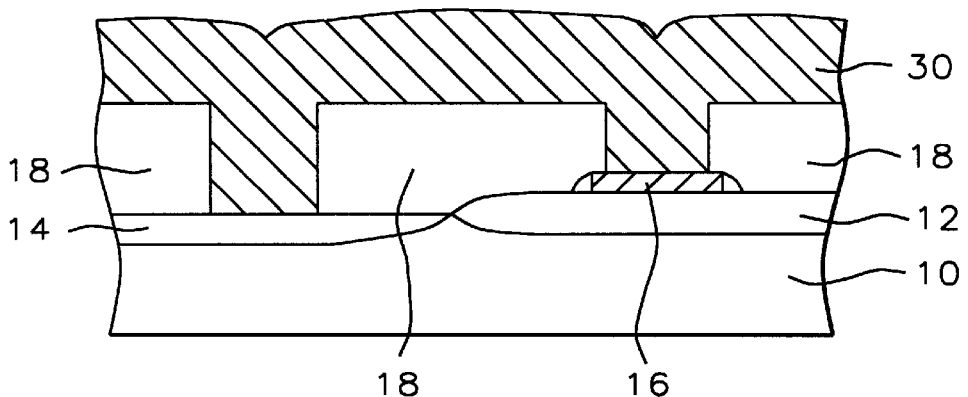
FIG. 4 shows a cross section view of the integrated circuit wafer of FIG. 3 with a blanket layer of titanium silicide formed on the wafer.

Next, as shown in FIG. 4, a blanket layer of titanium silicide, $TiSi_2$, is deposited on the wafer thereby completely filling the contact holes. The blanket layer of titanium silicide is deposited using chemical vapor deposition, CVD, from a combination of silane gas, $SiH_4$, and titanium tetrachloride gas, $TiCl_4$. The chemical vapor deposition used is either plasma enhanced chemical vapor deposition, PE-CVD, rapid thermal chemical vapor deposition, RT-CVD, or low pressure chemical vapor deposition, LP-CVD. The titanium silicide fills the contact holes completely, has good adhesion to the sidewalls of the contact holes, and forms a low resistance silicide contact with the silicon at the bottoms of the contact holes.

Figure 5:
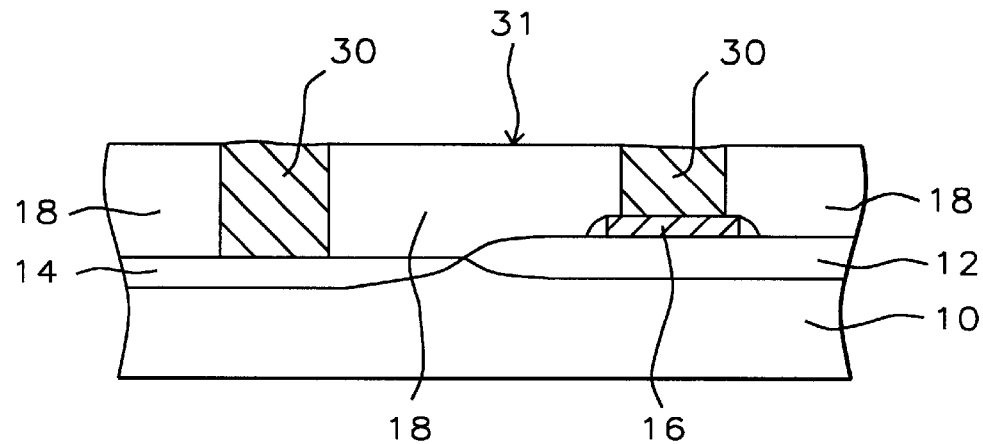
FIG. 5 shows a cross section view of the integrated circuit wafer of FIG. 4 after the titanium silicide has been etched back to the surface of the dielectric layer.

Next, as shown in FIG. 5, that part of the titanium silicide above the plane of the top surface of the dielectric layer 31 is removed using reactive ion etching or chemical mechanical polishing leaving titanium silicide plugs 30 in the contact holes. If reactive ion etching is used the reactive ion etching can be carried out in-situ after depositing the titanium without opening the chamber used for depositing the titanium silicide or, if vacuum was used for deposition of the titanium silicide, without breaking the vacuum. The reactive ion etching can also be carried out ex-situ with the wafer removed from the chamber used to deposit the titanium silicide. If chemical mechanical polishing is used the wafer must be removed from the chamber used to deposit the titanium silicide.

Refer now to FIGS. 2, 3, and 6–8 for another preferred embodiment of the method of this invention. FIG. 2 shows a cross section view of a part of an integrated circuit wafer showing the semiconductor wafer 10, a diffused region 14 formed in the wafer 10, and a field oxide isolation region 12. A polysilicon electrode 16 is shown formed on the field oxide region 12. A dielectric layer 18 is formed on the integrated circuit wafer. In this example the dielectric layer is silicon dioxide having a thickness of between about 0.7 and 1.0 micrometers.

As shown in FIG. 3, contact holes 20 are then formed in the dielectric layer 18. In this example the contact holes 20 are formed using reactive ion etching and have a diameter of between about 0.2 and 0.5 micrometers. FIG. 3 shows one contact hole 20 exposing part of a silicon junction region and one contact hole 21 exposing part of a polysilicon electrode.

Figure 6:
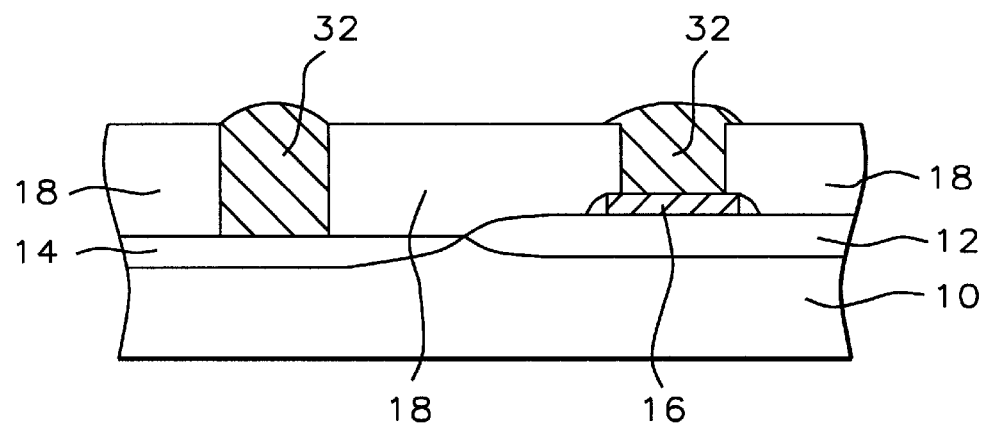
FIG. 6 shows a cross section view of the integrated circuit wafer of FIG. 3 with titanium silicide selectively deposited on the wafer.

Next, as shown in FIG. 6, titanium silicide, $TiSi_2$, is deposited selectively in the contact holes thereby completely filling the contact holes. The titanium silicide is deposited using chemical vapor deposition, CVD, from a combination of silane gas, $SiH_4$, gas and titanium tetrachloride gas, $TiCl_4$, and selectivity is achieved by adjusting the ratio of the flow rate of the $SiH_4$ to the flow rate of the $TiCl_4$. Titanium silicide can also be deposited using a combination of $SiH_2Cl_2$ gas and titanium tetrachloride gas, $TiCl_{41}$ and selectivity is achieved by adjusting the flow rate of the $SiH_2Cl_2$ to the flow rate of the $TiCl_4$.

FIG. 7 shows curves of the titanium silicide growth rate on silicon 42 and on silicon dioxide 44 as a function of the ratio of the flow rate of the $SiH_4$ to the flow rate of the $TiCl_{41}$ for the case where titanium silicide is deposited using $SiH_4$ and $TiCl_4$. The curves of FIG. 7 are taken from the Journal of the Electrochemical Society, Vol. 139, No. 4, 1992, page 1159. Since the bottoms of the contact holes are either silicon or polysilicon the flow rates of the $SiH_4$ and $TiCl_4$, or the flow rates of the $SiH_2Cl_2$ and $TiCl_4$ can be adjusted to provide a much greater titanium silicide deposition rate on the silicon at the bottoms of the contact holes than on the silicon dioxide so that the deposition of the titanium silicide fills the holes but does not deposit on the silicon dioxide. The selectivity is maintained by using a deposit/etch/deposit process wherein the deposition of the titanium silicide is interrupted by periods of in-situ reactive ion etching to remove any titanium silicide deposited on the top surface of the silicon dioxide layer followed by continued deposition of titanium silicide. The deposition and etching steps of the deposit/etch/deposit process can be repeated as often as necessary. Even though the titanium silicide deposits more readily on silicon compared to silicon dioxide, the titanium silicide has good adhesion to the sidewalls of the contact holes in the silicon dioxide layer. As in the preceding embodiment the chemical vapor deposition used is either plasma enhanced chemical vapor deposition, PE-CVD, rapid thermal chemical vapor deposition, RT-CVD, or low pressure chemical vapor deposition, LP-CVD.

Next, as shown in FIG. 8, that part of the titanium silicide above the plane of the top surface of the dielectric layer 31 is removed using reactive ion etching or chemical mechanical polishing leaving titanium silicide plugs 32 in the contact holes. If reactive ion etching is used the reactive ion etching can be carried out in-situ after depositing the titanium without opening the chamber used for depositing the titanium silicide or, if vacuum was used for deposition of the titanium silicide, without breaking the vacuum. The reactive ion etching can also be carried out ex-situ with the wafer removed from the chamber used to deposit the titanium silicide. If chemical mechanical polishing is used the wafer must be removed from the chamber used to deposit the titanium silicide.

Refer now to FIGS. 2, 3, 7, and 9–11 for still another preferred embodiment of the method of this invention. FIG. 2 shows a cross section view of a part of an integrated circuit wafer showing the semiconductor wafer 10, a diffused region 14 formed in the wafer 10, and a field oxide isolation region 12. A polysilicon electrode 16 is shown formed on the field oxide region 12. A dielectric layer 18 is f formed on the integrated circuit wafer. In this example the dielectric layer is silicon dioxide having a thickness of between about 0.7 and 1.0 micrometers.

As shown in FIG. 3, contact holes 20 are t hen formed in the dielectric layer 18. In this example the contact holes 20 are formed using reactive ion etching and have a diameter of between about 0.2 and 0.5 micrometers. FIG. 3 shows one contact hole 20 exposing part of a silicon junction region and one contact hole 21 exposing part of a polysilicon electrode.

Figure 9:
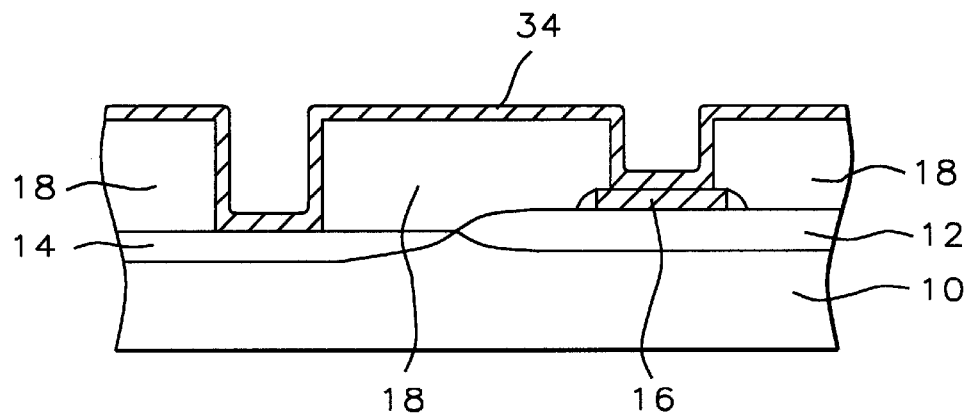
FIG. 9 shows a cross section view of the integrated circuit wafer of FIG. 3 with a titanium silicide adhesion layer formed on the wafer.

Next as shown in FIG. 9 a thin titanium silicide adhesion layer 34 is deposited on the wafer using chemical vapor deposition thereby forming an adhesion layer of titanium silicide on the top surface of the silicon dioxide, the sidewalls of the contact holes, and the bottoms of the contact holes but dot filling the holes. As can be seen from FIG. 7, the deposition rate of titanium silicide is greater on the silicon at the bottoms of the contact holes than on the silicon dioxide at the sidewalls of the contact holes and the top surface of the silicon dioxide layer. The deposition rates for this embodiment are adjusted so that the difference in deposition rates is less than in the selective deposition used in the preceding embodiment. This difference in deposition rates results in a thicker deposit of the titanium silicide adhesion layer at the bottoms of the contact holes than on the sidewalls of the contact holes or on the top surface of the silicon dioxide layer, as shown in FIG. 9.

Figure 10:
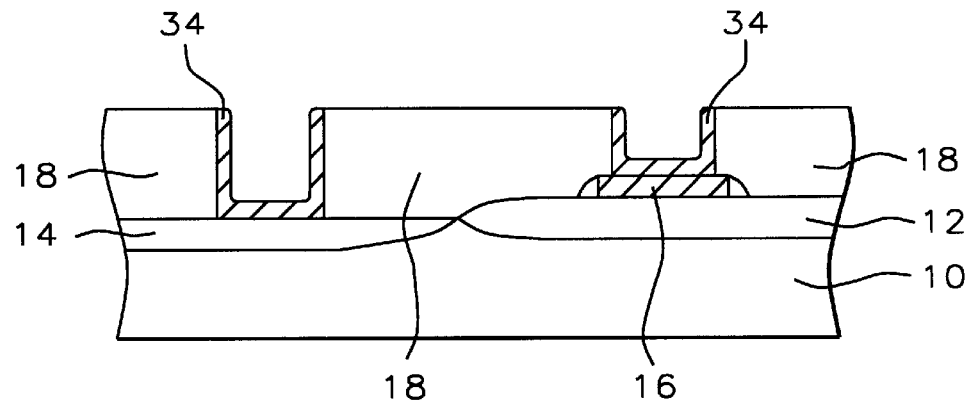
FIG. 10 shows a cross section view of the integrated circuit wafer of FIG. 9 after the titanium silicide adhesion layer has been etched back to the surface of the dielectric layer.

Next, as shown in FIG. 10, the titanium silicide adhesion layer 34 is etched back using in-situ or ex-situ reactive ion etching following the titanium silicide deposition so that titanium silicide adhesion layer 34 is left only on the sidewalls and bottoms of the contact holes.

Figure 11:
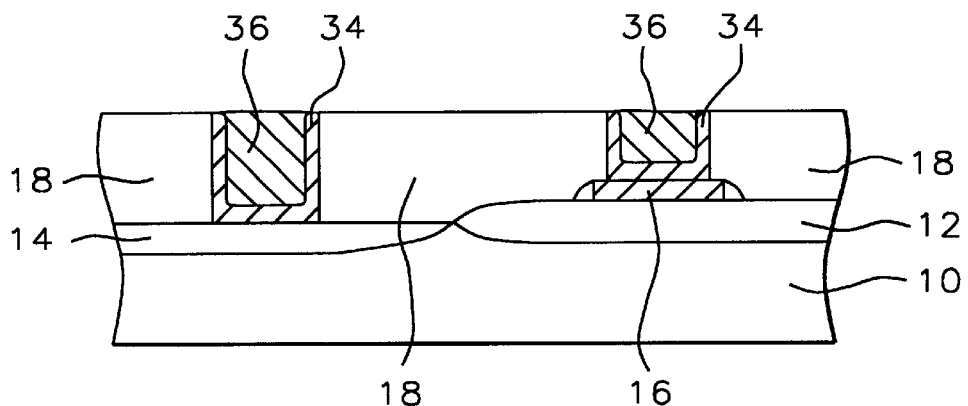
FIG. 11 shows a cross section view of the integrated circuit wafer of FIG. 10 after conductor metal has been selectively deposited on the titanium silicide layer.

Next, as shown in FIG. 11, a conductor metal 36 is selectively deposited on the titanium silicide adhesion layer 34 on the sidewalls and bottoms of the contact holes using selective chemical vapor deposition, thereby filling the contact holes with a plug of conductor metal 36. The conductor metal in this example is titanium silicide, tungsten, aluminum, or copper. Selectivity is achieved by adjusting the chemical deposition parameters and by using the deposit/etch/deposit process described earlier where the deposition is interrupted with periods of in-situ reactive ion etching.

While the invention has been particularly shown and described with reference to the preferred embodiments thereof, it will be understood by those skilled in the art that various changes in form and details may be made without departing from the spirit and scope of the invention.

What is claimed is:

1. A method of filling contact holes, comprising the steps of:

providing an integrated circuit wafer having devices formed therein and an electrode pattern formed thereon;

forming a layer of dielectric having a first surface and a second surface on said integrated circuit wafer, wherein said second surface of said layer of dielectric contacts said integrated circuit wafer;

forming contact holes, wherein each said contact hole has sidewalls and a bottom, in said layer of dielectric;

depositing a titanium silicide adhesion layer on said integrated circuit wafer, after forming said contact holes in said layer of dielectric, thereby depositing part of said titanium silicide adhesion layer on said sidewalls and said bottom of each of said contact holes as well as on said first surface of said layer of dielectric, wherein said depositing said titanium silicide adhesion layer is accomplished using chemical vapor deposition adjusted so that that part of said titanium silicide adhesion layer deposited on said bottom of each said contact hole is thicker than that part of said titanium silicide adhesion layer deposited on said sidewalls of each said contact hole or on said first surface of said layer of dielectric;

removing that part of said titanium silicide adhesion layer above the plane formed by said first surface of said layer of dielectric by means of reactive ion etching wherein said reactive ion etching is carried out in-situ or ex-situ after depositing said titanium silicide adhesion layer, thereby leaving part of said titanium silicide adhesion layer on said sidewalls and said bottom of each of said contact holes; and selectively depositing a conductor metal on said titanium silicide adhesion layer on said sidewalls and bottom of each of said contact holes by means of chemical vapor deposition, after removing that part of said titanium silicide adhesion layer above the plane formed by said first surface of said layer of dielectric, thereby filling said contact holes.

2. The method of claim 1 wherein said conductor metal is titanium silicide.

3. The method of claim 1 wherein said conductor metal is tungsten.

4. The method of claim 1 wherein said conductor metal is aluminum.

5. The method of claim 1 wherein said conductor metal is copper.

6. The method of claim 1 wherein said depositing said titanium adhesion layer so that that part of said titanium silicide adhesion layer deposited on said bottom of each said contact hole is thicker than that part of said titanium silicide adhesion layer deposited on said sidewalls of each said contact hole is accomplished by adjusting the flow ratio of the reaction gases used in said chemical vapor deposition.

7. The method of claim 1 wherein said layer of dielectric is a layer of silicon dioxide.

8. The method of claim 1 wherein said contact holes are formed using reactive ion etching.

* * * * *